(12) United States Patent
Petersen et al.

(10) Patent No.: US 8,151,030 B2
(45) Date of Patent: Apr. 3, 2012

(54) METHOD OF INCREASING DDR MEMORY BANDWIDTH IN DDR SDRAM MODULES

(75) Inventors: Ryan Petersen, Sunnyvale, CA (US); Franz Michael Schuette, Colorado Springs, CO (US)

(73) Assignee: OCZ Technology Group, Inc., San Jose, CA (US)

( * ) Notice: Subject to any disclaimer, the term of this patent is extended or adjusted under 35 U.S.C. 154(b) by 1615 days.

(21) Appl. No.: 11/138,768

(22) Filed: May 25, 2005

(65) Prior Publication Data

US 2005/0278474 A1    Dec. 15, 2005

Related U.S. Application Data

(60) Provisional application No. 60/521,570, filed on May 26, 2004.

(51) Int. Cl.
*G06F 12/00* (2006.01)
*G06F 13/00* (2006.01)

(52) U.S. Cl. ............ 711/5; 711/105; 711/154; 711/167
(58) Field of Classification Search .............. 711/5, 100, 711/105, 154, 167
See application file for complete search history.

(56) References Cited

U.S. PATENT DOCUMENTS

| | | | | |
|---|---|---|---|---|
| 5,835,956 A * | 11/1998 | Park et al. | ...................... | 711/167 |
| 6,151,236 A * | 11/2000 | Bondurant et al. | ............. | 365/49 |
| 6,200,144 B1 * | 3/2001 | Wark | .............................. | 439/74 |
| 6,330,636 B1 * | 12/2001 | Bondurant et al. | ........... | 711/105 |
| 2004/0004822 A1 | 1/2004 | Ruckerbauer | ................. | 361/785 |
| 2004/0103258 A1 * | 5/2004 | Blackmon et al. | ............ | 711/167 |
| 2005/0086037 A1 * | 4/2005 | Pauley et al. | .................. | 703/14 |

OTHER PUBLICATIONS

Multiple contributors, Microsoft Computer Dictionary, Microsoft Press, Fifth Edition, p. 147.*
International Preliminary Report on Patentability dated Dec. 21, 2006 for International Application No. PCT/US2005/018679 filed on May 26, 2005.

* cited by examiner

*Primary Examiner* — Tuan V. Thai
(74) *Attorney, Agent, or Firm* — DLA Piper LLP (US)

(57) ABSTRACT

The present invention provides a method of increasing DDR memory bandwidth in DDR SDRAM modules. DDR memory has an inherent feature called the Variable Early Read command, where the read command is issued one CAS latency before the termination of an ongoing data burst By using the Variable Early Read command the effect of the CAS latency is minimized in terms of the effect on bandwidth. The enhanced bandwidth technology achieved with this invention optimizes the remaining two access latencies ($t_{RP}$ and $t_{RCD}$) for optimal bandwidth. These optimizations in the SPD allow for much better bandwidth in real world applications.

25 Claims, 2 Drawing Sheets

US 8,151,030 B2

METHOD OF INCREASING DDR MEMORY BANDWIDTH IN DDR SDRAM MODULES

The present invention relates to, claims priority from, and expressly incorporates by reference U.S. Provisional Appl. Ser. No. 60/521,570 filed May 26, 2004, entitled "Method Of Increasing DDR Memory Bandwidth In DDR SDRAM Modules."

BACKGROUND OF INVENTION

1. Field of the Invention

The present invention generally relates to memory devices, and more particularly relates to increasing the bandwidth of DDR (double data rate) SDRAM (synchronous dynamic random access memory) modules.

2. Description of the Related Art

In the past, the widely held opinion was that the SPD (Serial Presence Detect) should be optimized primarily for the lowest possible timings of the CAS (column access strobe) latency. Less care was taken in the remaining three timings—$t_{RP}$ (RAS Precharge (precharge-to-activate delay)), $t_{RCD}$ (RAS to CAS delay), and $t_{RAS}$ (Active to Precharge delay)—accordingly the overall bandwidth of the module was not optimized to the degree possible.

By minimizing only the CAS latency, the module has a lower bandwidth, meaning that actual data transfer to and from the module is less than it could be.

SUMMARY OF INVENTION

The present invention provides a method of increasing DDR memory bandwidth in DDR SDRAM modules. The DDR SDRAM modules may conform to the DDR1, DDR2 or DDR3 standards (collectively known as DDR memory).

DDR memory has an inherent feature called the Variable Early Read command, where the read command is issued one CAS latency before the end of an ongoing transfer. By using the Variable Early Read command the effect of the CAS latency is minimized in terms of the effect on bandwidth. The enhanced bandwidth technology achieved with this invention optimizes the remaining two access latencies ($t_{RP}$ and $t_{RCD}$) for optimal bandwidth. These optimizations in the SPD allow for much better bandwidth in real world applications

BRIEF DESCRIPTION OF DRAWINGS

The present invention will be described, by way of example, with reference to the accompanying drawings, in which.

DETAILED DESCRIPTION

Figure 1:
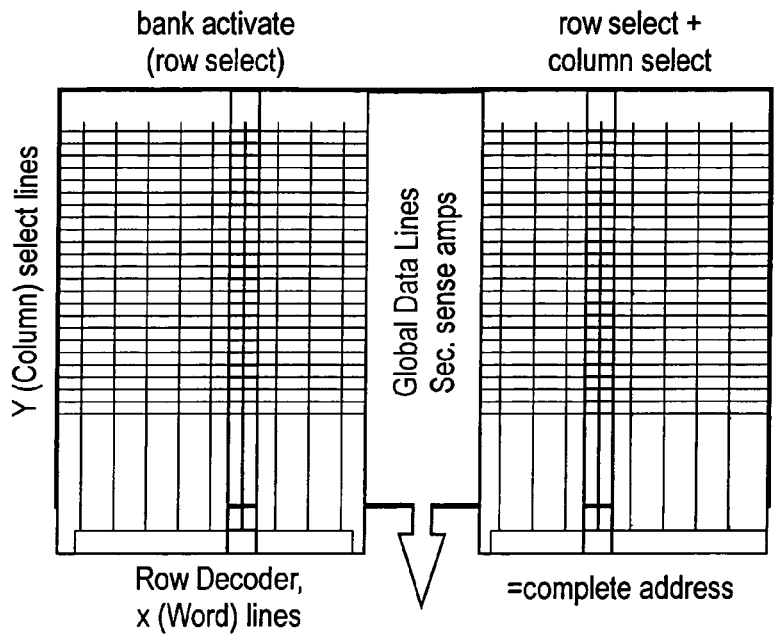
FIG. 1 is a schematic overview of an internal bank of a memory device: After a row has been selected and activated (highlighted area on left), the Column Address Strobe (CAS) can select a block of logically coherent addresses within this row (right). The number of page hits is limited among other factors by the limited number of column addresses within each page. Note that, per DRAM convention, rows are running vertically and columns horizontally.
Figure 2:
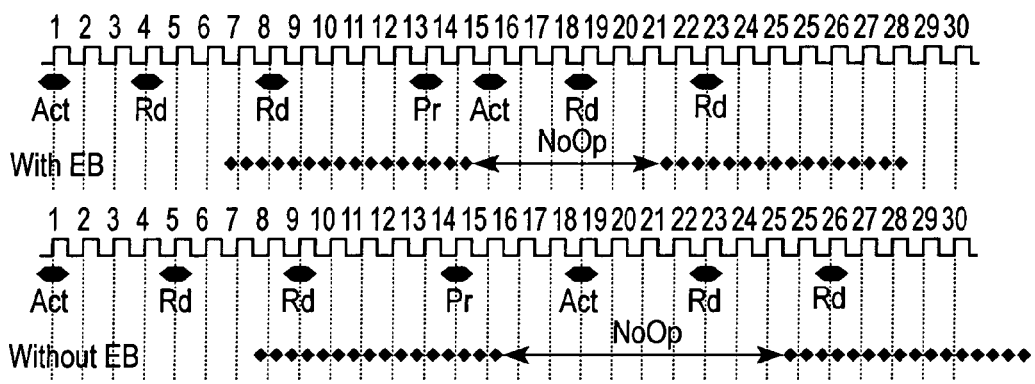
FIG. 2 is a timing diagram for two modules, one running at $t_{RCD}$-4.CL-2.5, $t_{RP}$-4 (bottom) and the second with $t_{RCD}$-3, CL-2.5-$t_{RP}$2 (top) showing two consecutive bursts of 8 from two different pages which is one of the most common scenarios in real world applications. The effective bandwidth is the ratio between data transfers (diamonds):NoOps (arrows) which, in the case of EB is 8:7 without EB, this ratio is 8:10, meaning that every transfer of 16 bits is penalized with either 7 or 10 subsequent bus idle cycles (Abbreviations used: $t_{RCD}$: RAS-to-CAS delay; CL: CAS latency; $t_{RP}$: precharge-to-activate delay; Clk: clock; Act: row activate command; Rd: read command; Pr: Precharge command, NoOp: No Operation).
Figure 3:
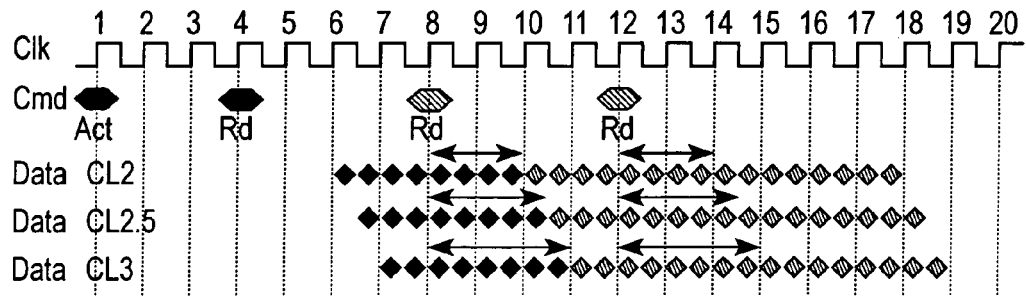
FIG. 3 shows the effect of issuing an Early Read Command on back-to-back transactions of consecutively requested data blocks within the same page. Following one Row Activate Command, three Read commands are given at a CAS Latency of either 2, 2.5 or 3. The squares are the data transfers that belong to the square-shaped Read Command. The graph shows that the net effect of increasing the CAS latency is a single cycle delay within a string of (in this case) 12 consecutive transfers but no degradation of bandwidth. The double-arrows indicate the CAS latency which is amended by moving the read command further to the left (relative to the end of the previous burst). (Abbreviations used: Clk: clock; Act: row activate command; Rd: read command; Pr: Precharge command, CL: CAS Latency).

The present invention provides enhanced bandwidth (EB) technology as a means of increasing memory bandwidth through the optimization of memory latencies for the best possible interaction between the system memory and the chipset and memory controller. Through thorough analysis of memory traffic and benchmark results under various operating conditions as defined by different memory latency settings in the CMOS setup of the BIOS, we have pinpointed the bottlenecks relevant for performance. Some conventional wisdom regarding some memory latencies were also found to no longer hold true. Using those findings, we redesigned our memory products to be optimized for delivering the highest possible bandwidth to any computer system.

Memory bandwidth is influenced by two major factors; frequencies and latencies. Transfer frequency, or data rate, is important since the theoretical peak bandwidth is defined by the bus width (in number of bits) multiplied by the frequency. Theoretical peak bandwidth is defined as the physical limit of the number of bytes that can be transferred from sender to receiver without counting idle bus period. Thus, with a fixed bus width, the total theoretical peak bandwidth is a factor of the operating frequency alone. In real life, however, this equation is not adequate. No computer system, regardless of how well it is optimized, is able to achieve peak transfer rates in a sustained fashion since only a limited number of back-to-back transactions can be carried out. Initial access latencies, along with memory-internal parameters such as page boundaries within the memory devices, pose an effective barrier to the actual peak bandwidth.

Some memory benchmarks work around these problems through implementation of prefetch algorithms to utilize the in-order queues, i.e., pipelined prefetch buffers on the chipset, along with bank interleaving on the memory device itself. The result is approximately 90 to 95% bus utilization based on the idea that recurrent access latencies can be hidden behind already pipelined data output from either I/O buffers on the DIMMs or the chipset. The DIMMs may conform to a small form factor. This is why some benchmarking programs return "Inflated" bandwidth scores that do not accurately reflect real world applications.

However, in most real world applications, only a small fraction of accesses stay "In page," meaning that the requested data are found within the address range of the currently open memory page. The ratio of page hits vs. page misses varies from one application to another. In network router and server applications, accesses are mostly random and result in almost no page hits, whereas a memory address pattern analysis we conducted demonstrated that in streaming video editing or gaming applications the number of page hits can reach 70 to 80%.

In most cases, the memory access pattern follows the general scheme that one page is opened with a row access and, subsequently, a small number of column addresses within that page get hit. Each page hit specifies a block of 64 column addresses that results in an output of eight transfers of eight bits each (in the case of an x8 memory device). In Interleaved mode, subsequent blocks do not need to follow a contiguous column address pattern as long as the sequence is predetermined. This is important for the understanding how, within a given page, the Column Address Strobe (CAS) can jump back and forth between higher and lower addresses without missing the page. However, given the limited number of column addresses within each page, there: is a limit to how many page hits can occur before a page boundary is finally met and the next memory request will miss the currently open page. Every such page miss will result in a complicated sequence of events. First, the currently open page must be closed. Since a read from a DRAM memory cell is destructive, data that were read out to the primary sense amplifiers within the array must be written back to the memory cells, after which the RAS lines need to be precharged: Closing a page takes between two and four clock cycles, during which time no other page can be activated. Only after a "virgin" state of the memory array has been reestablished can the next Row Activate command be issued. The performance penalties stemming from a precharge in an open-page situation will vary in severity depending on the number of latency cycles associated with the precharge-to-activate delay ($t_{RP}$), because the number of number of latency cycles of $t_{RP}$ will determine the number of "No Operation" (NoOp) cycles during which no data can be transferred. Keep in mind that with a DDR protocol, the penalties are doubled since each idle cycle causes a delay or miss of two transfers resulting in a severe reduction in effective bandwidth.

Before the next read (page hit) can occur, another page needs to be opened which includes a sequence that is the reverse of the precharge. First, a row address is decoded, followed by the row access strobe moving to the respective row address to pull the signal low for a logical true. This, in turn, opens the pass-gates to all memory cells within this row. The memory cells then discharge their contents to the primary sense amplifiers. After a voltage differential for each bitline pair has been sensed and amplified, a read command is issued. The time taken for this entire process is the RAS-to-CAS delay ($t_{RCD}$). Both $t_{RP}$ and $t_{RCD}$ are the two main factors that cause a reduction in effective memory bandwidth.

On average, there are three to four page hits following an initial page access. In those cases, the CAS latency (CL) determines the number of penalty cycles incurred between the read command and the start of data output to the bus. However, a read command can be issued concurrent with an ongoing data burst. This means that the read command for the next data burst can be issued before an ongoing data transfer is exhausted with the result that the latency cycles are hidden behind the previous transfer. CAS latency (CL), therefore plays a much smaller role in limiting bandwidth than RAS-to-CAS Delay or Precharge latency.

The diminished importance of CL is in contrast, though, to conventional wisdom that has labeled CL as the most important memory latency. However, this used to hold true for single data rate SDRAM, which is the reason why, until recent years, most memory manufacturers only listed their CL specifications and not the other latency parameters.

EB technology further capitalizes on another feature possible in DDR through the Variable Early Read Command. Early Read Command compensates for higher CAS latencies by changing the time at which a read command is issued relative to an ongoing transfer. More precisely, if there is an ongoing burst of data with a CL-2, the read command is issued two cycles before the end of the burst with the result that the next data output seamlessly follows the previous. With a CL-3, the read command is issued three cycles before the end of the ongoing transfer and this scheme can be extended to higher CAS latencies as well. Therefore, within any page, the bandwidth reduction by an increased CL is negligible.

EB technology series uses low $t_{RP}$ and $t_{RCD}$ latencies in combination with a Variable Early Read Command to allow for the highest possible effective data bandwidth. In most applications, the 2.5-2-3 (CL-$t_{RP}$-$t_{RCD}$) will deliver bandwidth that is indistinguishable from CL-2 modules, and $t_{RP}$ and $t_{RCD}$ latencies that are both lower than the CAS latency CL, such as 2.5,-2,-2 (CL-$t_{RP}$-$t_{RCD}$), will work even better.

Figure 4:
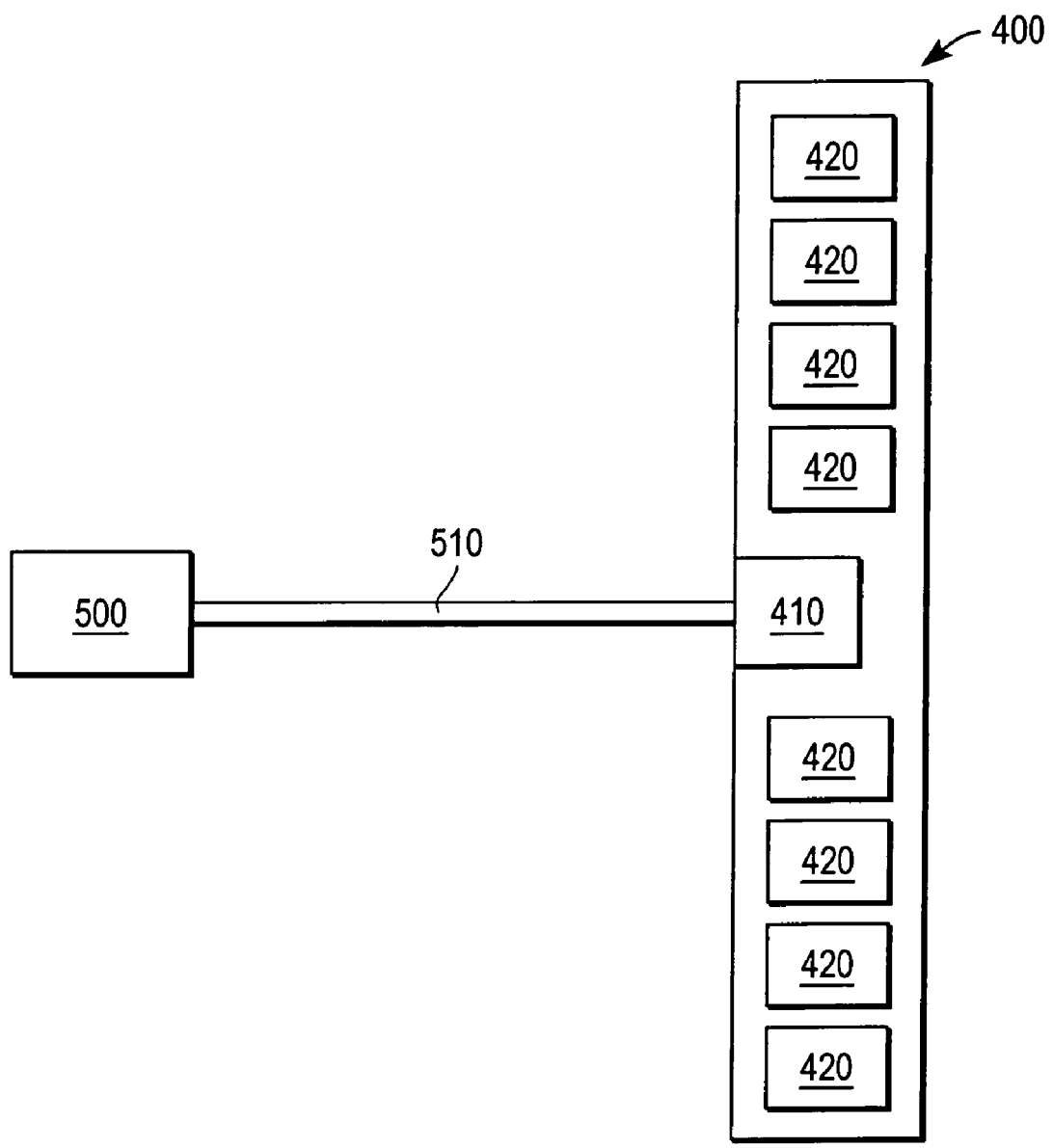
FIG. 4 illustrates an alternate embodiment of the present invention.

Current computer technology uses a dedicated memory controller that is either part of the chipset or else integrated directly on the CPU itself. The memory controller and/or the memory module may include firmware. This memory controller generates the addresses and commands at pre-specified timing intervals. However, one embodiment of the current invention, illustrated in FIG. 4, uses a memory controller integrated on the memory module 400 that includes a data buffer 410 and is fanning out to the individual memory integrated chips 420 to generate the addresses and commands at the specified latencies. Such a fully buffered module, connected to the core logic 500 via a high-speed serial bus 510 will see the same or better improvement of bandwidth according to the method of the invention.

While the invention has been described in terms of a specific embodiments. It is apparent that other forms could be adopted by one skilled in the art. Accordingly, it should be understood that the invention is not limited to any specific embodiment. It should also be understood that the phraseology and terminology employed above are for the purpose of disclosing the invention, and do not necessarily serve as limitations to the scope of the invention.

The invention claimed is:

1. A method for optimizing data transfer between memory modules and at least one memory controller using at least one memory module, the at least one memory module containing firmware and a plurality of double date rate (DDR) integrated circuit chips, each of said integrated circuit chips supporting page mode access, a bank activate command having associated therewith a row access strobe (RAS)-to-column access strobe (CAS) delay, a read command having associated therewith a CAS latency, and a precharge command having associated therewith a precharge latency, the method comprising the step of:

setting the firmware for high-speed access including: setting the CAS latency to a CAS latency value that is greater than a minimum CAS latency value supported by said integrated circuit chips at a selected frequency; and setting at least one of the RAS-to-CAS delay and the precharge latency to a RAS-to-CAS delay value and a precharge latency value, respectively, lower than the set CAS latency value to minimize access times of consecutive accesses in which a subsequent access is out-of-page from an immediately previous access; using said precharge command to close a first page where the immediately previous access occurred; and using said bank activate command to open a second page different than the first page to access data within said second page using the read command.

2. The method according to claim 1 where the integrated circuit chips used on the memory modules conform to the DDR1 standard.

3. The method according to claim 1 where the integrated circuit chips used on the memory modules conform to the DDR2 standard.

4. The method according to claim 1 where the integrated circuit chips used on the memory modules conform to the DDR3 standard.

5. The method according to claim 4, wherein at least one memory module conforms to a small form factor.

6. The method according to claim 4 wherein both the RAS-to-CAS delay value and the precharge latency value are set lower than the set CAS latency value.

7. The method according to claim 1, wherein the at least one memory module conforms to a small form factor.

8. The method according to claim 1, wherein the at least one memory module conforms to a fully buffered DIMM.

9. The method of claim 1 where the precharge command is generated by the integrated circuit chips used on the memory modules.

10. The method according to claim 1 wherein both the RAS-to-CAS delay value and the precharge latency value are set lower than the set CAS latency value.

11. The method according to claim 1 wherein the steps of setting result in reduced missed read accesses during the steps of using.

12. A memory apparatus comprising: a memory controller; at least one memory module that communicates with the memory controller and contains a plurality of double date rate (DDR) integrated circuit chips, each of said integrated circuit chips supporting page mode access, a bank activate command having associated therewith a row access strobe (RAS)-to-column access strobe (CAS) delay, a read command having associated therewith a CAS latency, and a precharge command having associated therewith a precharge latency; and firmware for high speed access, wherein the firmware for high-speed access includes: a CAS latency value for setting the CAS latency that is greater than a minimum CAS latency value supported by said integrated circuit chips at a selected frequency; and a RAS-to-CAS delay value and a precharge latency value for setting the RAS to CAS delay and the precharge latency, respectively, at least one of the RAS-to-CAS delay value and the precharge latency value being set lower than the set CAS latency value to minimize access times of consecutive accesses in which a subsequent access is out-of-page from an immediately previous access, such that the firmware specifies minimal numbers of penalty cycles from: said precharge command until a first page where the immediately previous access occurred is closed; and said bank activate command until a second page different than the first page is opened to access data within said second page using the read command.

13. The apparatus according to claim 12 wherein the memory controller is integrated with the at least one memory module.

14. The apparatus according to claim 12 wherein the memory controller is separate from the at least one memory module.

15. The apparatus according to claim 12 wherein the firmware is integrated with the at least one memory module.

16. The apparatus according to claim 12 wherein the firmware is separate from the at least one memory module.

17. The apparatus according to claim 12 wherein the memory controller is a plurality of memory controllers, each of which communicates with the at least one memory module.

18. The apparatus according to claim 12 where the integrated circuit chips used on the memory modules conform to one of DDR1, DDR2, and DDR3 standards.

19. The apparatus according to claim 18 where the at least one memory module conforms to a small form factor.

20. The apparatus according to claim 18 wherein both the RAS-to-CAS delay value and the precharge latency value are set lower than the set CAS latency value.

21. The apparatus according to claim 12 where the at least one memory module conforms to a small form factor.

22. The apparatus according to claim 12 where the at least one memory module conforms to a fully buffered DIMM.

23. The apparatus of claim 12 where the precharge command is generated by the integrated circuit chips used on the memory module.

24. The apparatus according to claim 12 wherein both the RAS-to-CAS delay value and the precharge latency value are set lower than the set CAS latency value.

25. The apparatus according to claim 12 wherein the CAS latency value, RAS-to-CAS delay value and the precharge latency value settings result in reduced missed read accesses.

\* \* \* \* \*